US012218540B2

United States Patent
Namikawa et al.

(10) Patent No.: US 12,218,540 B2
(45) Date of Patent: Feb. 4, 2025

(54) CONTROL DEVICE FOR SECONDARY BATTERY TO CORRECT BATTERY CHARACTERISTICS ON OPEN CIRCUIT VOLTAGE TO REMAINING CAPACITY

(71) Applicant: Panasonic Intellectual Property Management Co., Ltd., Osaka (JP)

(72) Inventors: Kazuhiko Namikawa, Osaka (JP); Yudai Yamaguchi, Nara (JP); Junya Kamijima, Osaka (JP); Toru Wanibuchi, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 682 days.

(21) Appl. No.: 17/558,842

(22) Filed: Dec. 22, 2021

(65) Prior Publication Data

US 2022/0115890 A1    Apr. 14, 2022

Related U.S. Application Data

(63) Continuation of application No. PCT/JP2020/025357, filed on Jun. 26, 2020.

(30) Foreign Application Priority Data

Jun. 27, 2019    (JP) .................................. 2019-119974

(51) Int. Cl.
  *H02J 7/00*    (2006.01)
  *G01R 31/367*    (2019.01)
  (Continued)

(52) U.S. Cl.
  CPC ........ *H02J 7/00712* (2020.01); *G01R 31/367* (2019.01); *G01R 31/374* (2019.01);
  (Continued)

(58) Field of Classification Search
  CPC ..................................................... G01R 31/36
  See application file for complete search history.

(56) References Cited

U.S. PATENT DOCUMENTS

| 2008/0180062 | A1 | 7/2008 | Okumura | |
| 2008/0234956 | A1* | 9/2008 | Mizuno | G01R 31/367 702/63 |
| 2022/0003822 | A1* | 1/2022 | Naito | G01R 31/3842 |

FOREIGN PATENT DOCUMENTS

| JP | 2008-185500 A | 8/2008 |
| JP | 2018-169237 A | 11/2018 |
| JP | 2018-169238 A | 11/2018 |

OTHER PUBLICATIONS

International Preliminary Report on Patentability of related International Application No. PCT/JP2020/025357 dated Dec. 28, 2021 (English translation).

(Continued)

*Primary Examiner* — Julian D Huffman
*Assistant Examiner* — Sadia Kousar
(74) *Attorney, Agent, or Firm* — Renner, Otto, Boisselle & Sklar, LLP

(57) ABSTRACT

The present disclosure provides a control device for a secondary battery, and the control device includes a controller configured to correct battery characteristics on an open circuit voltage to a remaining capacity of the secondary battery. In the control device for the secondary battery, the controller acquires data of a plurality of open circuit voltages in the battery characteristics during charging the secondary battery. When the secondary battery is fully charged, the controller corrects the open circuit voltages between respective pairs selected and combined from at least one part of the data of the plurality of open circuit voltages. The controller weighted-averages and corrects full charge capacities, which are calculated by the correction of the open (Continued)

circuit voltages between the respective data pairs, with differences each between respective remaining capacities each corresponding between the respective data pairs.

9 Claims, 6 Drawing Sheets

(51) Int. Cl.
| | |
|---|---|
| *G01R 31/374* | (2019.01) |
| *G01R 31/3835* | (2019.01) |
| *H01M 10/0525* | (2010.01) |
| *H01M 10/42* | (2006.01) |
| *H01M 10/44* | (2006.01) |
| *H01M 10/48* | (2006.01) |

(52) U.S. Cl.
CPC .... *G01R 31/3835* (2019.01); *H01M 10/0525* (2013.01); *H01M 10/425* (2013.01); *H01M 10/44* (2013.01); *H01M 10/48* (2013.01); *H02J 7/00032* (2020.01); *H02J 7/0049* (2020.01)

(56) References Cited

OTHER PUBLICATIONS

International Search Report for corresponding Application No. PCT/JP2020/025357, mailed Sep. 15, 2020.

\* cited by examiner

CONTROL DEVICE FOR SECONDARY BATTERY TO CORRECT BATTERY CHARACTERISTICS ON OPEN CIRCUIT VOLTAGE TO REMAINING CAPACITY

CROSS REFERENCE TO RELATED APPLICATION

This is a continuation application of International Application No. PCT/JP2020/025357, with an international filing date of Jun. 26, 2020, which claims priority of Japanese Patent Application No. 2019-119974 filed on Jun. 27, 2019, each of the contents of which is incorporated herein by reference.

BACKGROUND OF INVENTION

1. Field of Invention

The present disclosure relates to a control device and a control method for a secondary battery such as a lithium ion secondary battery, and to electronic equipment having the secondary battery.

2. Description of Related Art

The secondary battery such as the lithium ion secondary battery has such a problem as deterioration due to repeated charging and discharging to reduce the full charge capacity (actual capacity). For this reason, techniques for estimating the full change capacity of the secondary battery and characteristics thereof have been known. In this case, the terms and their abbreviations used below are defined.

Open circuit voltage (OCV): open circuit voltage (mV)
Sum of charge (SOC): charge amount (mAh)
Relative state of charge (RSOC): remaining capacity (%)
Full charge capacity (FCC): full charge capacity (mAh)

For example, there are the following conventional methods for capacity correction of secondary batteries.
(1) Secondary Battery Calibration The full charge capacity of a secondary battery is corrected by once fully charging the secondary battery and then completely discharging it. This method is highly accurate, however, the method is less frequently carried out because electronic equipment (personal computer, or the like) using the secondary battery becomes unusable in a predetermined time.
(2) 2-Point OCV Correction (see JP 2018-169238 A)

In the secondary battery capacity correction technique of a conventional example, the full charge capacity of the secondary battery is corrected from OCV data at 2 points and the charge and discharge amount therebetween. Specifically, the processes are performed as follows:

step SS1) acquiring an open circuit voltage OCV1 (mV) when 1 hour or more has elapsed without charging and discharging, to measure a charge and discharge amount AQ (mAh) of the secondary battery while the user is using it;

step SS2) acquiring an open circuit voltage OCV2 (mV) when not charging and discharging for 1 hour or more next time; and step SS3) obtaining the full charge capacity from the acquired OCV data and RSOC-OCV characteristics proper to the secondary battery pack.

SUMMARY OF INVENTION

Generally, the RSOC is obtained at the time of acquisition of the OCV from the RSOC-OCV characteristics of the secondary battery. In particular, when the RSOC-OCV characteristics are not corrected despite deterioration of the secondary battery and decrease in the full charge capacity, for example, the jump estimation of the full charge capacity (remaining amount) occurs. Specifically, there has been such a problem that, although the RSOC-OCV characteristics change relatively little with changes in the capacity and temperature, if the characteristics deviate even a little, the calculation will be greatly different at the 2 points where the data are acquired.

An object of the present disclosure is to provide a secondary battery control device capable of correcting the full charge capacity of the secondary battery with higher accuracy compared with the 2-point OCV correction method of the conventional example.

According to a control device for a secondary battery of the present disclosure, the control device includes a controller configured to correct battery characteristics on an open circuit voltage to a remaining capacity of the secondary battery. The controller acquires data of a plurality of open circuit voltages in the battery characteristics during charging the secondary battery. When the secondary battery is fully charged, the controller corrects the open circuit voltages between respective data pairs selected and combined from at least one part of the data of the plurality of open circuit voltages. The controller weighted-averages and corrects full charge capacities, which are calculated by the correction of the open circuit voltages between the respective data pairs, with differences each between respective remaining capacities each corresponding between the respective data pairs.

According to the secondary battery control device of the present disclosure, the full charge capacity of the secondary battery can be corrected with higher accuracy compared to the 2-point OCV correction method of the conventional example.

DETAILED DESCRIPTION OF INVENTION

An embodiment will hereinafter be described in detail with reference to the drawings appropriately. Note however that more detailed description than necessary may be omitted. For example, detailed description of already well-known matters and duplicated description for substantially the same configuration may be omitted. This is for the purpose of preventing the following description from becoming unnecessarily redundant, to thereby facilitate the understanding of those skilled in the art.

The inventors provide the accompanying drawings and the following description in order to allow those skilled in the art to fully understand the present disclosure, but do not intend to limit thereby the subject matters defined in the claims.

Embodiments

Figure 1:
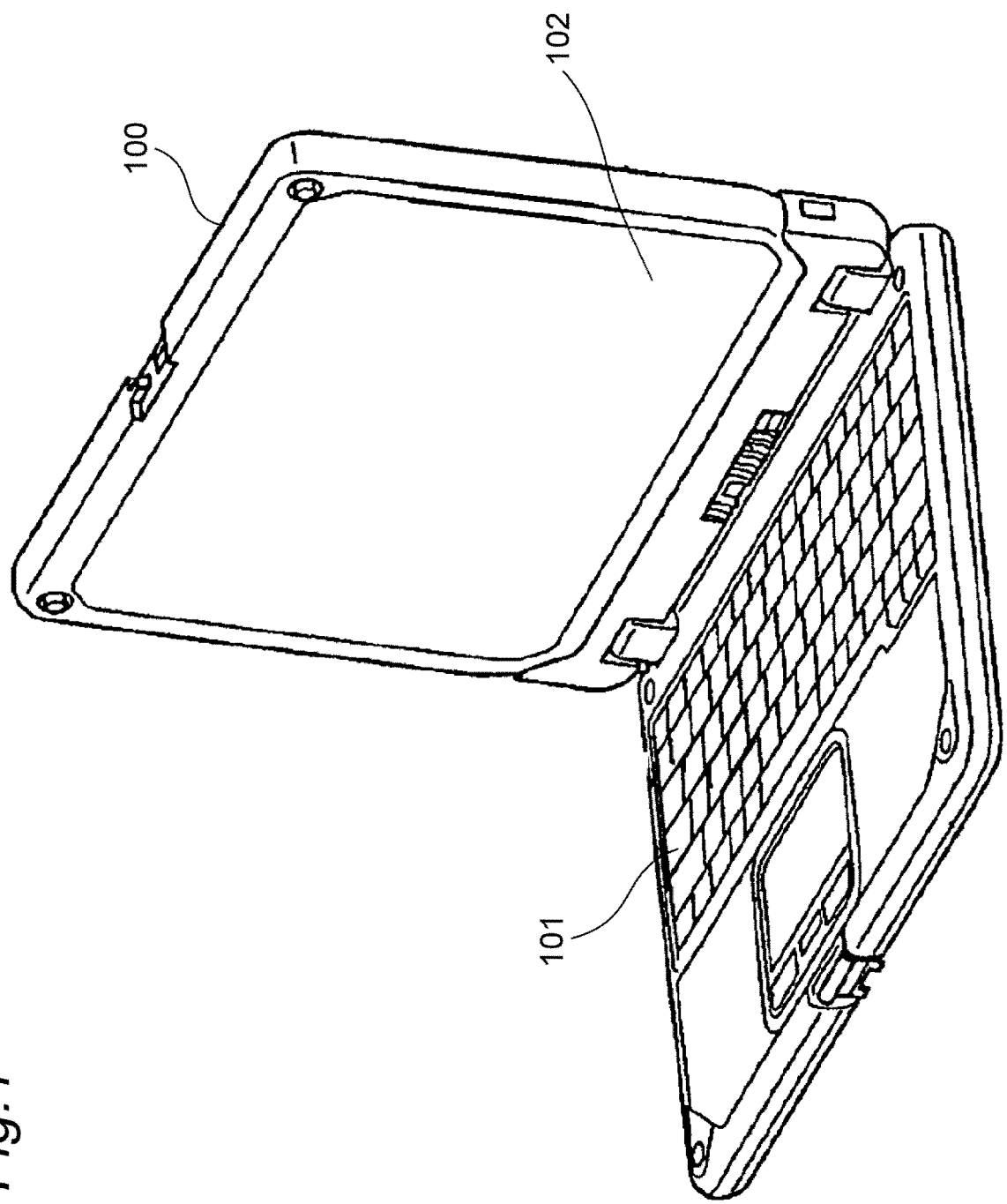
FIG. 1 is an external view of electronic equipment mounted with a lithium-ion secondary battery according to an embodiment.

FIG. 1 is an external view of electronic equipment mounted with a lithium-ion secondary battery.

Referring to FIG. 1, a personal computer 100 is mounted with a lithium-ion secondary battery (not shown in FIG. 1; 300 in FIGS. 2 and 3) to operate. The lithium-ion secondary battery is provided, for example, on a bottom surface which is the back side of a keyboard 101 or on the rear side of the bottom surface of a joint portion between a key board 101 and a display 102.

In the present disclosure, a personal computer is exemplified as the electronic equipment mounted with the lithium-ion secondary battery. However, the present disclosure is not limited thereto. Other types of electronic equipment such as smartphones, cellular phones, and tablets are also available as long as it is electronic equipment mounted with a secondary battery such as the lithium-ion secondary battery to operate.

Figure 2:
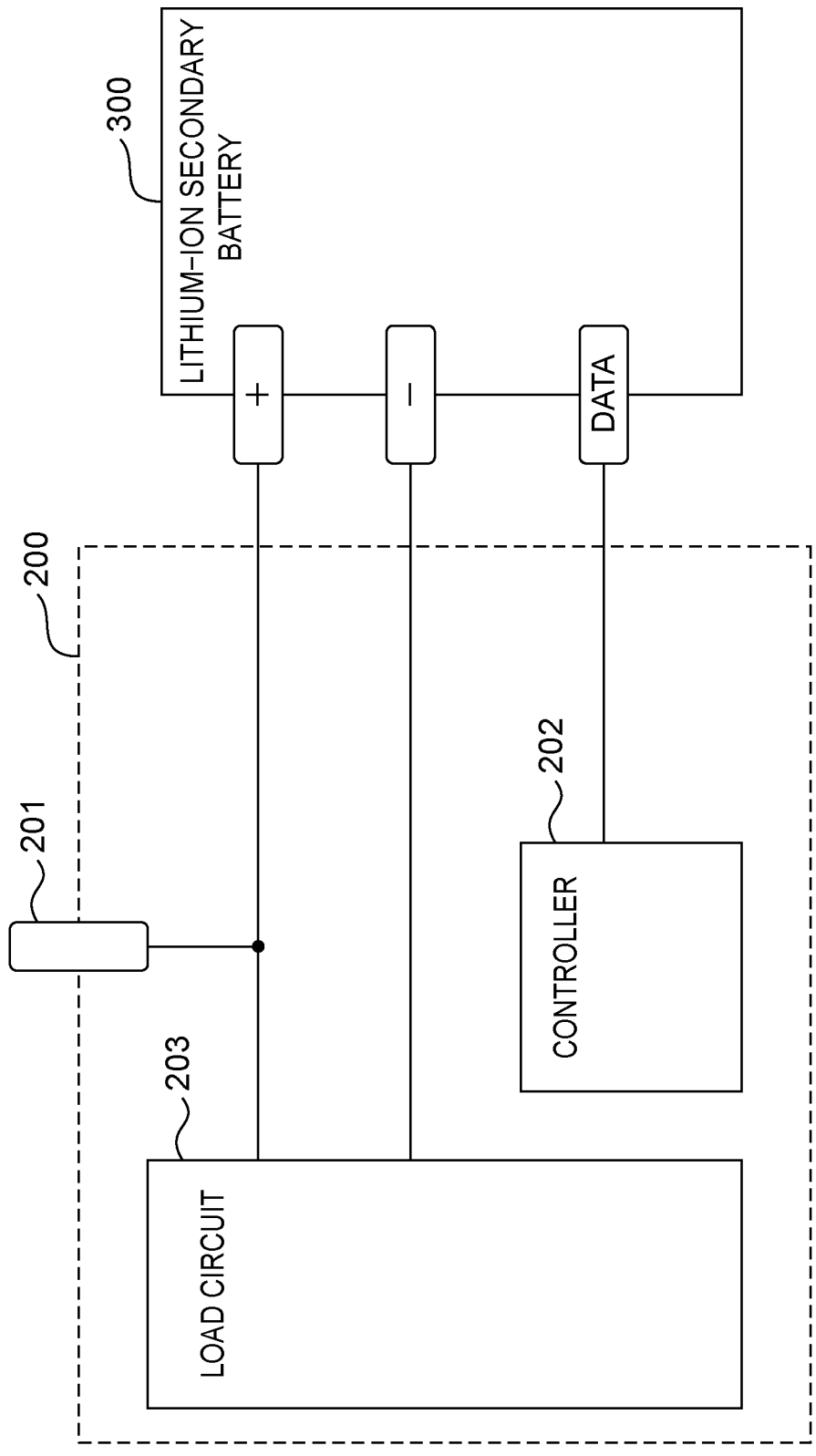
FIG. 2 is a block diagram showing a functional configuration example of the electronic equipment of FIG. 1.

FIG. 2 is a block diagram showing a functional configuration example of the electronic equipment mounted with the lithium-ion secondary battery according to the present embodiment. Referring to FIG. 2, the personal computer 100 comprises a body part 200 and a lithium-ion secondary battery 300. The body part 200 includes a power supply terminal 201, a controller 202, and a load circuit 203.

Referring to FIG. 2, the power supply terminal 201 is a terminal to which a power line is connected when electric power is supplied from the outside. By using electric power supplied from the power supply terminal 201, the lithium-ion secondary battery 300 is charged. The controller 202 controls the load circuit 203 and other hardware, etc. of the personal computer 100. In this embodiment, particularly, the controller 202 controls the lithium-ion secondary battery 300. The controller 202 can be configured by a microprocessing unit (MPU), a dedicated integrated circuit (IC), or the like. The controller 202 can be configured by a digital signal processor (DSP), a field programmable gate array (FPGA), or the like.

The load circuit 203 is an electric circuit that operates by electric power input from the power supply terminal 201 or electric power supplied from the lithium-ion secondary battery 300. In case of the personal computer 100, the load circuit 203 corresponds to various devices that make up a general computer, such as a CPU, a memory, and a display.

The lithium-ion secondary battery 300 includes therein one or a plurality of lithium-ion secondary battery cell(s). By charging and discharging these cells, it becomes possible to accumulate electric power obtained from the body part 200 or to supply electric power to the body part 200. The lithium-ion secondary battery 300 is electrically connected to the body part 200 by a positive connection terminal and a negative connection terminal (power-supply connection terminal), and a data communication terminal.

Figure 3:
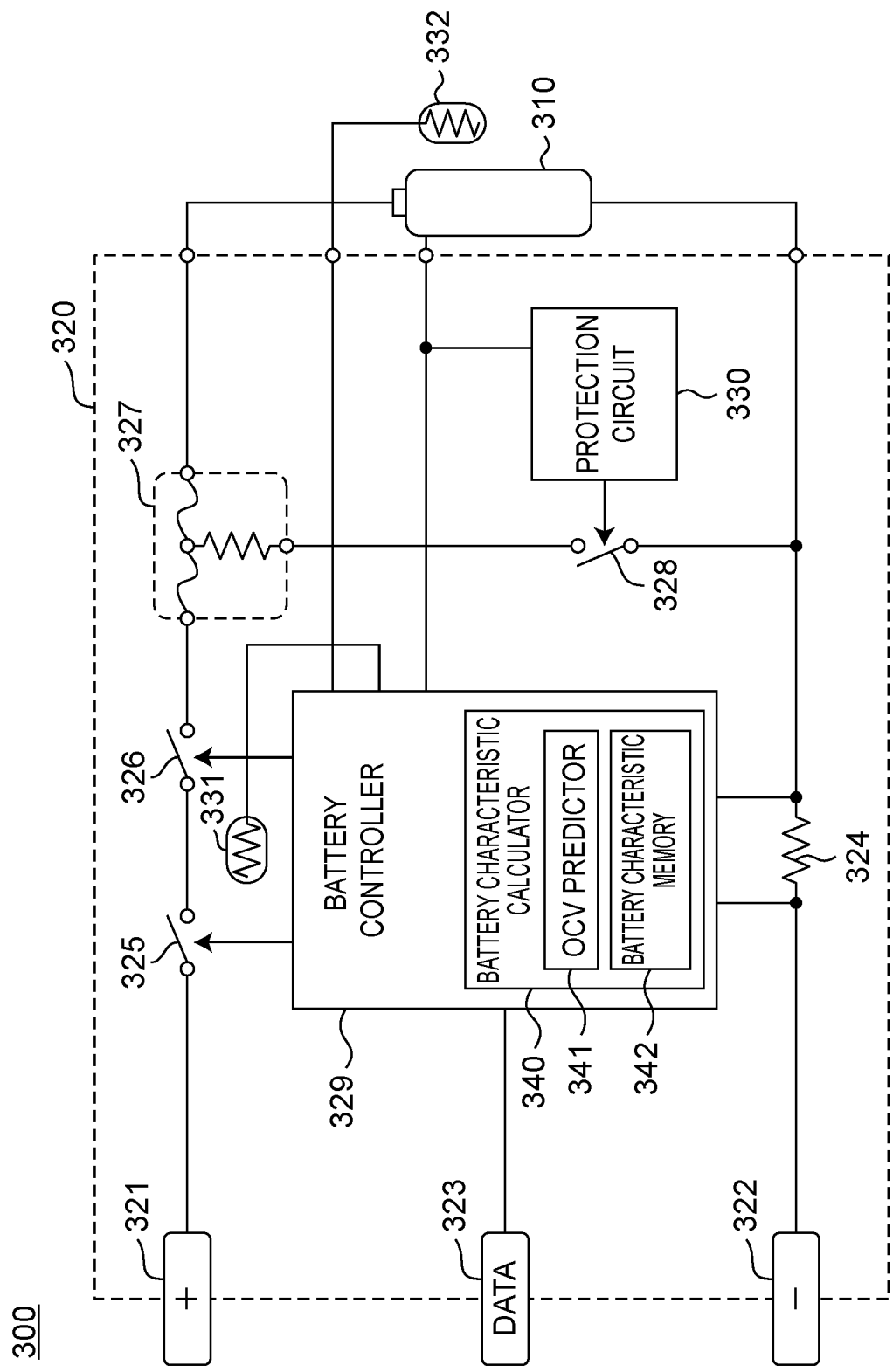
FIG. 3 is a block diagram showing a configuration example of the lithium-ion secondary battery of FIG. 2.

FIG. 3 is a configuration diagram of the lithium-ion secondary battery 300 of FIG. 2. The lithium-ion secondary battery 300 includes a battery cell block 310 and a control module 320.

Referring to FIG. 3, the battery cell block 310 includes a battery cell(s) capable of charging with lithium ions as an electrolyte. The battery cell block 310 includes one or a plurality of battery cells, depending on the performance required for the lithium-ion secondary battery.

The control module 320 controls charging to or discharging from the battery cell block 310. The control module 320 includes a positive terminal 321, a negative terminal 322, a data terminal 323, a current detection resistor 324, a charging switch 325, a discharging switch 326, a fuse 327, a switch 328, a battery controller 329, a protection circuit 330, a first temperature sensor 331, and a second temperature sensor 332.

The positive terminal 321 and the negative terminal 322 are terminals that are electrically connected when charging from the body part 200 to the lithium-ion secondary battery 300 or when discharging from the lithium-ion secondary battery 300 to the body part 200. The lithium-ion secondary battery 300 transfers and receives DC electric power to and from the body part 200. The data terminal 323 is a terminal that is used when the body part 200 and the lithium-ion secondary battery 300 communicate with each other. More specifically, via this terminal, the controller 202 of the body part 200 and the battery controller 329 of the lithium-ion secondary battery 300 transmit and receive data, commands, etc.

The current detection resistor 324 is an electrical resistor that is utilized to detect a current of electric power discharged from the lithium-ion secondary battery 300 or a current of electric power charging the lithium-ion secondary battery 300. The battery controller 329 measures a voltage difference between both ends of the current detection resistor 324, to calculate a current value.

The charging switch 325 and the discharging switch 326 are switches that are each used to control the battery cell block 310. These switches are controlled by the battery controller 329.

While the battery cell block 310 is charged with electric power, the battery controller 329 controls the charging switch 325 and the discharging switch 326 to suppress the overvoltage and overdischarge of the battery cells making up the battery cell block 310. Each of these switches is implemented by a MOSFET or the like.

The fuse 327 is disposed for the purpose of protecting the battery cell block 310 from the overcurrent or overcharge (overvoltage). When detecting the overcurrent and/or overvoltage, etc. to the battery cell block 310, the protection circuit 330 closes the switch 328 to allow current to flow to the resistance of the fuse 327. The resistance of the fuse 327 blows the fuse 327 by heat generated by electric current. As a result, the battery cell block 310 is electrically disconnected, and is protected from the overcurrent or overvoltage.

The battery controller 329 controls the entire lithium-ion secondary battery 300. The battery controller 329 communicates with the controller 202 in the body part 200 via the data terminal 323. The battery controller 329 calculates a current value, based on the voltage difference between both the ends of the current detection resistor 324. The battery controller 329 also controls the charging switch 325 and the discharging switch 326. The battery controller 329 also acquires temperature information from the first temperature sensor 331 and the second temperature sensor 332. The battery controller 329 measures not only the current and temperature but also the voltage of the battery cell block 310. In case that the battery cell block 310 is configured by a plurality of battery cells connected in series, the battery controller 329 measures not only the overall voltage but also the individual voltages of all the battery cells.

The battery controller 329 is connected to nonvolatile storage media (not shown). These can be implemented by, for example, an electrically erasable programmable read-only memory (EEPROM) or a NAND flash memory. On these storage media, the battery controller 329 records and stores, as needed, the calculated current value, the acquired temperature information, and the voltage value of the battery cell block 310. The battery controller 329 records information specified by the controller 202 on this storage medium.

The protection circuit 330 is disposed for the purpose of protecting the battery cell block 310. In case that an abnormality or the like of the battery cell block 310 is detected despite the fact that the battery controller 329 controls the charging switch 325 and the discharging switch 326, the protection circuit 330 turns on the switch 328 to blow the fuse 327.

The battery controller 329 and the protection circuit 330 can be implemented (configured) by the micro-processing unit (MPU) or the dedicated integrated circuit (IC), or the like. The battery controller 329 and the protection circuit 330 can be implemented by the digital signal processor (DSP) or the field programmable gate array (FPGA), or the like.

The nonvolatile storage media connected to the battery controller 329 may be disposed separately from the battery controller 329 or may be disposed within the battery controller 329.

The first temperature sensor 331 measures the temperatures of the charging switch 325 and the discharging switch 326. The second temperature sensor 332 measures the temperature of the battery cell block 310. In case that the battery cell block 310 includes a plurality of battery cells, the second temperature sensor 332 may be configured so as to be able to measure the temperature of each of the battery cells.

The battery controller 329 is further characterized by including a battery characteristic calculator 340 having an OCV predictor 341, and a battery characteristic memory 342 storing the battery characteristics therein. In this case, the battery characteristic calculator 340 uses an OCV prediction process at the time of battery charging of FIG. 6 to executes a battery characteristic calculation process including a battery capacity correction process of FIG. 5. The battery characteristic calculator 340 combines OCV data of a multiplicity of points, performs the 2-point OCV correction plural times, and calculates an average value thereof, and this leads to reduction in the variations in calculation of the 2 points in the RSOC-OCV characteristics, described in the above problem of prior art.

Figure 4:
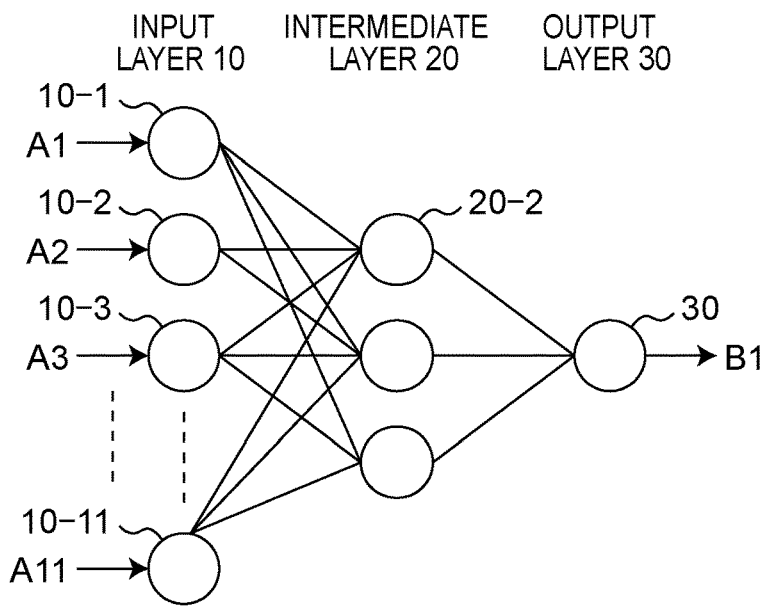
FIG. 4 is a block diagram showing a configuration example of an OCV predictor of FIG. 3.

FIG. 4 is a block diagram showing a configuration example of the OCV predictor 341 of FIG. 3.

Referring to FIG. 4, the OCV predictor 341 is configured from a neural net such as a three-layer perceptron 400 that forms so-called artificial intelligence (AI). The three-layer perceptron 400 is configured to include eleven input layers 10-1 to 10-11 (designated collectively at reference numeral 10), three intermediate layers 20-1 to 20-3 (designated collectively at reference numeral 20), and one output layer 30. Each of the input layers 10 is connected to all of the intermediate layers 20. Each of the intermediate layers 20 is connected to the output layer 30.

At the time of training the three-layer perceptron 400, training data of input items A1 to A11 are respectively entered to the input layers 10, and training result datum of an output item B1 is set to the output layer 30, so that the three-layer perceptron 400 is trained. Next, at the time of operation, respective detection data of the input items A1 to A11 are entered as the input items A1 to A11 to the input layers 10, and this leads to that the output item B1 can be obtained. Examples of the input items A1 to A11 and the output item B1 are as follows:

A1 to A10: Voltage fluctuation value at step S14 of FIG. 6 described later;

A11: Battery temperature detected by the second temperature sensor 332; and

B1: OCV (V).

The configuration of FIG. 4 of the OCV predictor 341 of FIG. 3 is an example, and the OCV predictor 341 is configurable from a neural network or the like such as various perceptrons. It can also be implemented by utilizing a support vector machine that is one type of machine learning in place of the neural network, or by using a predictive calculation by a linear approximation based on the distribution of collected data.

Figure 5:
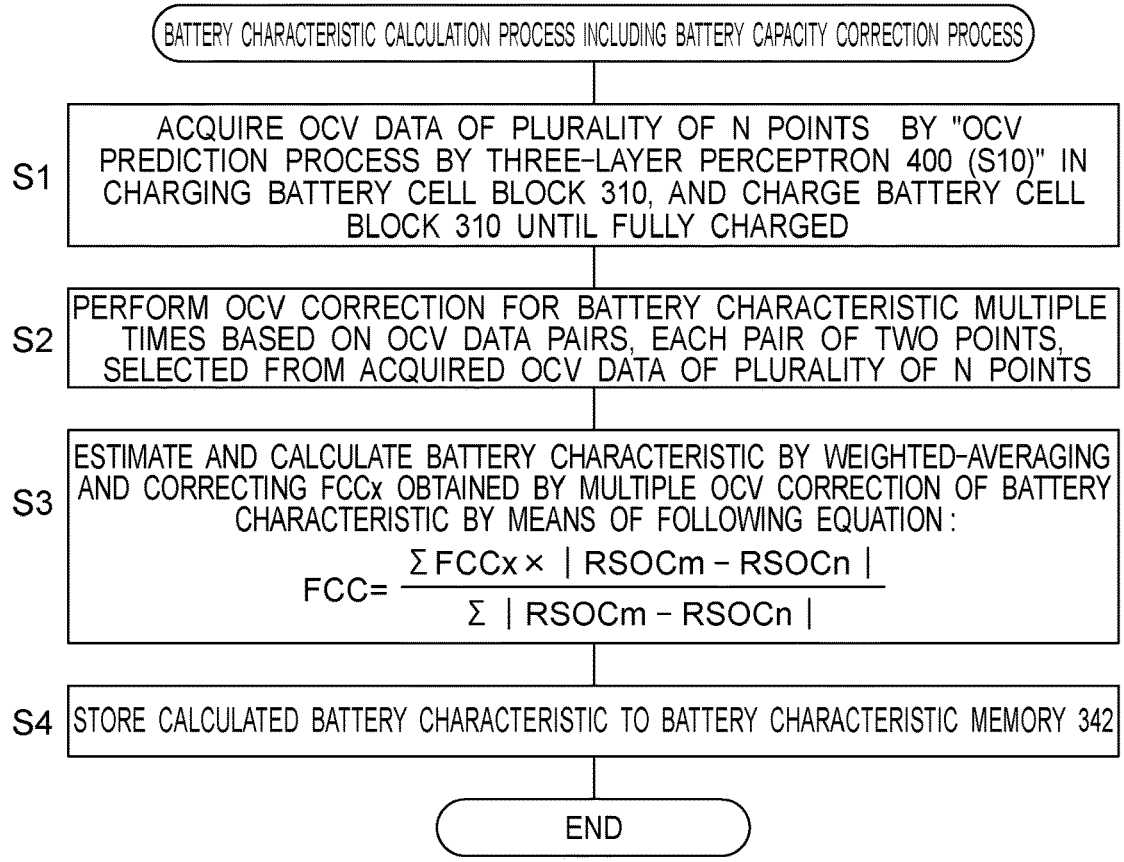
FIG. 5 is a flowchart showing a battery characteristic calculation process including battery capacity correction process executed by a battery characteristic calculator of FIG. 3.

FIG. 5 is a flowchart showing a battery characteristic calculation process including a battery capacity correction process executed by the battery characteristic calculator of FIG. 3.

At step S1 of FIG. 5, at the time of charging during which the battery cell block 310 including the secondary battery is charged, OCV data of a plurality of N points are acquired by an "OCV prediction process using the three-layer perceptron 400" (S10 of FIG. 6), to charge the battery cell block 310 until fully charged.

Next, at step S2, the OCV correction of the RSOC-OCV characteristics (hereinafter, referred to as battery characteristics) is executed plural times, based on, among the acquired OCV data of a plurality of N points, respective OCV data pairs (see FIG. 7) of 2 points according to all of combinations (although all of combinations are preferred, at least some of combinations are also acceptable in the present disclosure) configured by any 2 points selected from the plurality of N points. Furthermore, at step S3, a plurality of FCCx obtained from the plural times of OCV correction of the battery characteristics are, for example, weighted-averaged and corrected by using the following equation, to estimate and calculate the battery characteristics in order to reduce the variations at the measurement points through averaging of the plurality of FCCx obtained by the 2-point OCV correction.

$$FCC = (\Sigma FCCx \times |RSOCm - RSOCn|) / \Sigma |RSOCm - RSOCn| \quad (2),$$

where $m, n = 1, 2, \ldots, N$ ($m \neq n$), and N is the maximum number of OCV data. While a plurality of FCCx obtained by the 2-point OCV correction are subjected to the weighted-averaging, they may undergo predetermined statistical processing that uses, for example, a method such as simple averaging in which a probable value is found from data having variations Next, at step S4, the calculated battery characteristics are stored into the battery characteristic memory 342 to end the battery characteristic calculation process.

Figure 6:
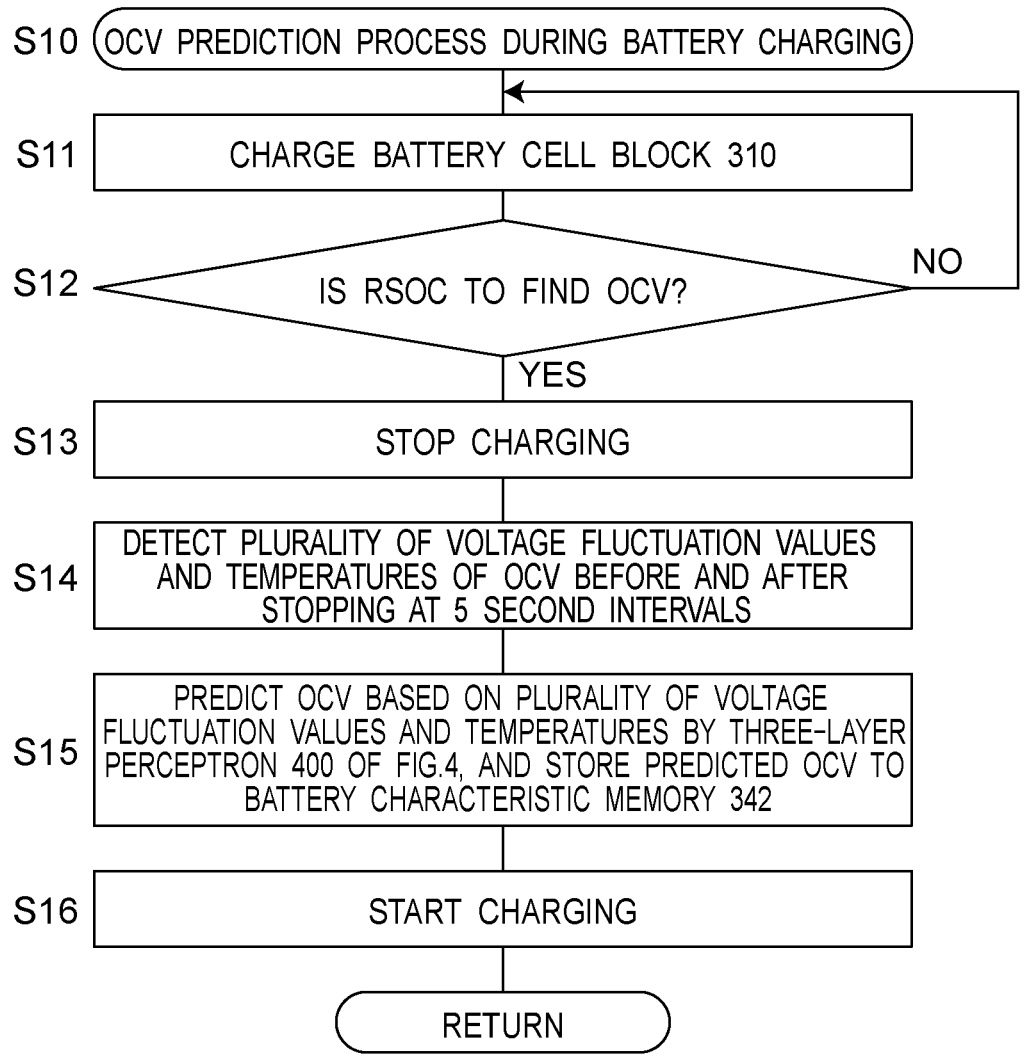
FIG. 6 is a flowchart showing an OCV prediction process at the time of battery charging, that is a subroutine of step S1 in FIG. 5.

FIG. 6 is a flowchart showing the OCV prediction process at the time of battery charging, that is a subroutine of step S1 of FIG. 5.

At step S11 of FIG. 6, the battery cell block 310 is charged. At step S12, it is determined after the lapse of a predetermined time from the start of charging whether the remaining capacity has a level to find the OCV. If YES, the control flow goes to step S13, whereas if NO, the control flow goes to step S11. The predetermined time at step S12 is time determined by individual battery characteristics, or the like and is, for example, 30 seconds, 1 minute, 3 minutes, 5 minutes, or 10 minutes.

At step S13, the charging is stopped, and at step S14, a plurality of voltage fluctuation values of OCVs between before and after the stop at predetermined time intervals such as 5 seconds, and a temperature sensed by the second temperature sensor 332 are detected.

Next, at step S15, based on the plurality of voltage fluctuation values and the temperature, the OCV is predicted by the three-layer perceptron 400 of FIG. 4 and is stored in the battery characteristic memory 342, and at step S16, charging is started and the process returns to the main routine.

Figure 7:
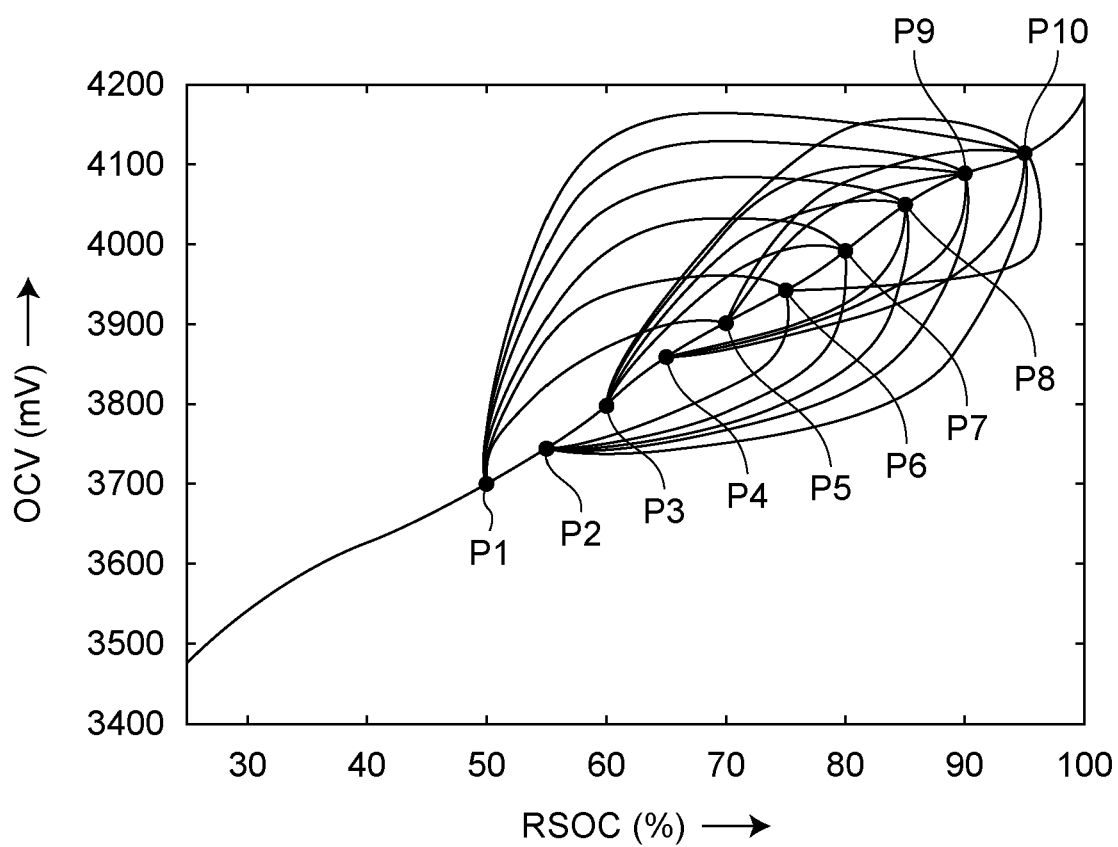
FIG. 7 is a graph representing RSOC-OCV characteristics, showing the battery capacity correction process of the embodiment.

FIG. 7 is a graph representing RSOC-OCV characteristics, showing the battery capacity correction process of the embodiment. In FIG. 7, P1 to P10 denote respective OCV data at step S2 of FIG. 5 on the RSOC-OCV characteristics. FIG. 7 shows that the OCV correction of the RSOC-OCV characteristics (battery characteristics) is executed plural times, based on, among OCV data of 10 points, OCV data (see FIG. 7) of 2 points according to some of combinations configured by any 2 points selected from the 10 points.

The above correction process of FIGS. 5 and 6 has unique effects as follows:

(1) charging can be stopped at a determined remaining capacity;

(2) there are few variations in voltage fluctuations, compared to those when discharging; and (3) this enables the full charge capacity of the secondary battery to be corrected with high accuracy, compared to the two-point OCV correction method according to the conventional example.

Modified Embodiment

In the above embodiment, although the battery controller 329 including the OCV predictor 341 and the battery characteristic memory 342 is disposed within the control module 320, the present disclosure is not limited thereto, and it may be disposed in the controller 202 of FIG. 2.

Examples

In experiments of the inventors, training and evaluations of the three-layer perceptron 400 of FIG. 4 were performed by using experimental data of 375 data sets, 300 training sets, and 75 evaluation sets, and then, a mean error of 4.43 mV per one cell of the secondary battery, a maximum error of 15 mV, and a standard deviation of 3.56 mV were obtained.

It is preferred that a simple perceptron be effectively used as the perceptron of FIG. 3, considering constraints on the parameter data size, etc. imposed when incorporating artificial intelligence.

It is also preferred that only the following data be used for calculation of the FCC in order to reduce the calculation errors in the correction process:

$$|RSOCm - RSOCn| > \text{predetermined value (e.g. 20\%)} \quad (3).$$

It is further preferred to use only a predetermined value (e.g. 50%) or more of the remaining capacity because individual differences are large in regions where the OCV is small.

It is still further preferred to set the lower limit of the secondary battery temperature to a predetermined temperature (e.g. 10° C.) because the RSOC-OCV characteristics change at low temperatures.

The technique described in the present disclosure can be industrially utilized in electronic equipment such as, personal computers, smartphones, cellular phones, and tablets, which utilize secondary batteries such as, lithium-ion secondary batteries.

What is claimed is:

1. A control device for a secondary battery, the control device comprising a controller configured to correct battery characteristics on an open circuit voltage to a remaining capacity of the secondary battery,
   wherein the controller acquires data of a plurality of open circuit voltages in the battery characteristics during charging the secondary battery,
   wherein, when the secondary battery is fully charged, the controller corrects the open circuit voltages between respective data pairs selected and combined from at least one part of the data of the plurality of open circuit voltages, and
   wherein the controller weighted-averages and corrects full charge capacities, which are calculated by the correction of the open circuit voltages between the respective data pairs, with differences each between respective remaining capacities each corresponding between the respective data pairs.

2. The control device for the secondary battery as claimed in claim 1,
   wherein, when the controller acquires data of the plurality of open circuit voltages in the battery characteristics during charging the secondary battery, the controller stops the charging for a predetermined time during charging the secondary battery, and then, predicts an open circuit voltage of the secondary battery, based on a plurality of voltage fluctuation values of the open circuit voltages at predetermined time intervals between before and after the stopping and on a temperature of the secondary battery.

3. The control device for the secondary battery as claimed in claim 2,
   wherein the controller trains a neural network, that receives as input the plurality of voltage fluctuation values of the open circuit voltages and the temperature of the secondary battery and outputs the open circuit voltages, by using predetermined training sets, and the controller predicts the open circuit voltages of the secondary battery by a trained neural network.

4. The control device for the a secondary battery as claimed in claim 3,
   wherein the neural network is a three-layer perceptron.

5. Electronic equipment comprising the control device for the secondary battery as claimed in claim 1.

6. A control method for a secondary battery executed by a control device including a controller configured to correct battery characteristics on an open circuit voltage to a remaining capacity of the secondary battery, the control method comprising the steps of:
   by the controller, acquiring data of a plurality of open circuit voltages in the battery characteristics during charging the secondary battery;
   when the secondary battery is fully charged, by the controller, correcting the open circuit voltages between respective data pairs selected and combined from at least one part of the data of the plurality of open circuit voltages, and by the controller, weighted-averaging and correcting full charge capacities, which are calculated by the correction of the open circuit voltages between the respective data pairs, with differences each between respective remaining capacities each corresponding between the respective data pairs.

7. The control method for the secondary battery as claimed in claim 6,
wherein the step of acquiring the data of the plurality of open circuit voltages in the battery characteristics during charging the secondary battery includes stopping the charging for a predetermined time during charging the secondary battery, and then, predicting an open circuit voltage of the secondary battery, based on a plurality of voltage fluctuation values of the open circuit voltages at predetermined time intervals between before and after the stopping and on a temperature of the secondary battery.

8. The control method for the secondary battery as claimed in claim 7,
wherein the step of predicting the open circuit voltages of the secondary battery comprises:
training a neural network, that receives as input the plurality of voltage fluctuation values of the open circuit voltages and the temperature of the secondary battery and outputs the open circuit voltages, by using predetermined training sets; and
predicting the open circuit voltages of the secondary battery by a trained neural network.

9. The control method of a secondary battery as claimed in claim 8,
wherein the neural network is a three-layer perceptron.

* * * * *